(12) United States Patent
Weinrich et al.

(10) Patent No.: US 6,210,595 B1
(45) Date of Patent: Apr. 3, 2001

(54) METHOD FOR PRODUCING STRUCTURES HAVING A HIGH ASPECT RATIO AND STRUCTURE HAVING A HIGH ASPECT RATIO

(75) Inventors: Volker Weinrich, München; Manfred Engelhardt, Feldkirchen-Wetserham, both of (DE)

(73) Assignee: Infineon Technologies AG, Müenchen (DE)

(*) Notice: Subject to any disclaimer, the term of this patent is extended or adjusted under 35 U.S.C. 154(b) by 0 days.

(21) Appl. No.: 09/149,829

(22) Filed: Sep. 8, 1998

(30) Foreign Application Priority Data

Sep. 8, 1997 (DE) .............................................. 197 39 224

(51) Int. Cl.[7] .............................. C23F 1/00; H01L 21/302
(52) U.S. Cl. ................................ 216/70; 216/67; 216/69; 216/46; 438/668; 438/696; 438/710; 438/712; 438/720; 438/732; 428/469; 428/697
(58) Field of Search ....................................... 438/668, 696, 438/700, 702, 703, 720, 722, 742, 743, 744, 947, 706, 707, 710, 717, 712, 728, 732; 216/67, 69, 70, 46; 428/469, 209, 210, 626, 697

(56) References Cited

U.S. PATENT DOCUMENTS

| | | | |
|---|---|---|---|
| 4,400,257 | 8/1983 | Taylor | 204/192 |
| 4,533,430 | * 8/1985 | Bower | 438/695 |
| 4,702,795 | 10/1987 | Douglas | 156/643 |
| 5,143,866 | * 9/1992 | Matsutani | 438/696 |
| 5,258,093 | * 11/1993 | Maniar | 438/3 |
| 5,401,675 | * 3/1995 | Lee et al. | 438/653 |
| 5,409,563 | * 4/1995 | Cathey | 438/715 |
| 5,468,340 | * 11/1995 | Gupta et al. | 216/67 |
| 5,728,619 | * 3/1998 | Tsai et al. | 438/297 |

OTHER PUBLICATIONS

Japanese Patent Abstract No. 53–64668 (Katou), dated Dec. 8, 1979.
"Thin Film Processes", Vossen et al., Academic Press New York, 1978, pp. 538–543.
"Calculations On Depositions And Redeposition In Plasma Etch Process", Hübner, J. Electrochem. Soc., vol. 139, No. 11, Nov. 1992, pp. 3302–3309.
"Profile Simulation Of Plasma Enhanced And ECR Oxide Deposition With Sputtering", Chang et al., IEDM 93–853, 1993 IEEE, 35.1.1–35.1.1; (No Month).
"High–K Dielectric Materials For DRAM Capacitors", David E. Kotecki, Semiconductor International, Nov. 1996.
"A Buried Capacitor Cell With Bonded SOI For 256–Mbit and !–Gbit DRAMs", Nishihara et al., Solid State Technology, Jun. 1994, pp. 89–94.
"Crown–Shaped Stacked–Capacitor Cell For 1.5V Operation 64–Mb DRAM's", Kaga et al., IEEE Transactions On Electron Devices, vol. 38, No. 2, Feb. 1991, pp. 255–261.

* cited by examiner

Primary Examiner—Deborah Jones
Assistant Examiner—Stephen Stein
(74) Attorney, Agent, or Firm—Herbert L. Lerner; Laurence A. Greenberg; Werner H. Stemer

(57) ABSTRACT

A method for producing structures having a high aspect ratio includes the following steps: a material of the structure to be produced is provided in the form of a layer, a mask is applied to the layer, the layer is subjected to dry etching using the mask, thereby forming redepositions of the layer material on side walls of the mask and the mask is removed, so that a structure having a high aspect ratio is left behind. The method enables very high ($\geq 1$ μm) and very thin ($\leq 50$ nm) structures to be produced in a relatively simple and rapid manner in only very few process steps and with only one mask technique. Structures having such large aspect ratios, particularly when they are composed of a conductive material, cannot be produced, or can be produced only with a high outlay, by using other methods.

17 Claims, 2 Drawing Sheets

METHOD FOR PRODUCING STRUCTURES HAVING A HIGH ASPECT RATIO AND STRUCTURE HAVING A HIGH ASPECT RATIO

BACKGROUND OF THE INVENTION

Field of the Invention

The present invention relates to a method for producing structures having a high aspect ratio, as well as to structures having a high aspect ratio.

During the last 25 years, the storage density of DRAM memory chips has quadrupled from one generation to the next. However, the fundamental structure of an elementary memory cell as well as the materials used to construct the memory cell have remained essentially unchanged during that time. Just like 25 years ago, a DRAM memory cell includes a transistor and a capacitor which stores the charge necessary to represent the information. The capacitor of the memory cell has electrodes made of doped silicon and/or polysilicon and a dielectric layer made of silicon dioxide and/or silicon nitride disposed between the electrodes.

In order to ensure that the charge stored in a capacitor may be read out in a reproducible manner, the capacitance of the capacitor should have at least a value of about 30 fF. At the same time, the lateral extent of the capacitor has had and is having to be continually reduced in size in order to be able to achieve the aforementioned increase in the storage density. Those inherently contrasting requirements of the capacitor of the memory cell have led and are leading to ever more complex structuring of the capacitor ("trench capacitors", "stacked capacitors", "crown-shaped capacitors") in order to be able to provide a sufficient capacitor area despite the lateral extent of the capacitor becoming smaller. Accordingly, however, production of the capacitor becomes more and more complicated and thus more and more expensive.

Another way of ensuring that the capacitor has a sufficient capacitance is to use different materials between the capacitor electrodes. Recently, therefore, the conventional silicon oxide/silicon nitride has been replaced by the use of new materials, in particular paraelectrics and ferroelectrics, between the capacitor electrodes of a memory cell. Those new materials have a distinctly higher relative permittivity (>20) than the conventional silicon oxide/silicon nitride (<8). That means that given the same capacitance and the same lateral extent of the memory cell, the requisite capacitor area and thus the requisite complexity of the structuring of the capacitor can be distinctly reduced by the use of those materials. Barium strontium titanate (BST, $(Ba,Sr)TiO_3$), lead zirkonate titanate (PZT, $Pb(Zr,Ti)O_3$) and lanthanum-doped lead zirkonate titanate or strontium bismuth tantalate (SBT, $SrBi_2Ta_2O_9$) are used, for example.

Unfortunately, using the new paraelectrics or ferroelectrics also means using new electrode materials. The new paraelectrics or ferroelectrics are usually deposited onto existing electrodes (bottom electrodes). Processing takes place at high temperatures. The materials of which the capacitor electrodes are normally composed, thus e.g. doped polysilicon, are easily oxidized and lose their electrically conductive properties at those temperatures, which would lead to failure of the memory cell.

Due to their good oxidation resistance and/or the formation of electrically conductive oxides, $4d$ and $5d$ transition metals, in particular platinum metals (Ru, Rh, Pd, Os, Ir, Pt) and particularly platinum itself, as well as rhenium, are promising candidates that might replace doped silicon/polysilicon as electrode material.

However, if a simply structured "stacked capacitor" suffices to provide the requisite capacitance, when the new materials (e.g. platinum and BST) are used for the first time, the unabating miniaturization of the memory cell in further DRAM generations means that the capacitors composed of the new materials must also be structured correspondingly more complexly in order to ensure a sufficient capacitor area. Large surfaces in conjunction with a small lateral extent can only be obtained, as a rule, through the use of structures having a large aspect ratio (ratio of height to width). However, it is precisely structures of that type that cannot be produced, or can be produced only with a high outlay, using the new paraelectrics or ferroelectrics and the new electrode materials.

SUMMARY OF THE INVENTION

It is accordingly an object of the invention to provide a method for producing structures having a high aspect ratio, in particular from the above-mentioned materials, as well as a structure having a high aspect ratio, which overcome the hereinafore-mentioned disadvantages of the heretofore-known methods and devices of this general type.

With the foregoing and other objects in view there is provided, in accordance with the invention, a method for producing structures having a high aspect ratio, which comprises providing a material of a structure to be produced, in the form of a layer; applying a mask with side walls to the layer; subjecting the layer to dry etching using the mask and forming redepositions of the layer material on the side walls of the mask; removing the mask and leaving behind a structure having a high aspect ratio.

The method according to the invention enables very high ($\geq 1$ $\mu$m) and very thin ($\leq 50$ nm) structures to be produced in a relatively simple and rapid manner in only very few process steps and with only one mask technique. Structures having such large aspect ratios, particularly when they are composed of a conductive material, cannot be produced, or can be produced only with a high outlay, by using other methods.

In accordance with another mode of the invention, a plasma etching process is used for the dry etching of the layer.

In accordance with a further mode of the invention, during the dry etching of the layer, a gas or gas mixture, preferably a noble gas, is provided which does not form volatile compounds with the material of the structure to be produced.

In accordance with an added mode of the invention, a number of processes can be used for the dry etching of the layer. Reactive ion etching (RIE), magnetically enhanced reactive ion etching (MERIE), electron cyclotron resonance etching (ECR etching) or inductively coupled plasma etching processes (ICP, TCP) are preferably used for the dry etching of the layer.

In accordance with an additional mode of the invention, the aspect ratio of the structure is greater than 2, preferably greater than 10, in particular greater than 20.

In accordance with yet another mode of the invention, the structure is constructed to be a self-stabilizing structure.

In accordance with yet a further mode of the invention, the structure is constructed to be a closed structure, for example a closed ring.

In accordance with yet an added mode of the invention, a multiplicity of materials may be used. Preferably, however, the layer contains a metal, in particular copper, iron, cobalt, nickel, or a 4d or 5d transition metal, in particular a platinum metal.

In accordance with yet an additional mode of the invention, the layer contains platinum, gold, silver, iridium, palladium, ruthenium, rhenium or oxides thereof.

In accordance with again another mode of the invention, there is provided at least one further layer applied to the structure, again resulting in a structure having a high aspect ratio.

In accordance with again a further mode of the invention, the further layer is an insulation layer.

In accordance with again an added mode of the invention, the further layer contains a ferroelectric material, a dielectric material, in particular a dielectric material having high relative permittivity, a perovskite or precursors of these materials. In this case, a precursor of the above-mentioned materials is to be understood to mean a material which can be converted into the above-mentioned materials through the use of suitable heat treatment (e.g. annealing), if appropriate with oxygen being fed in.

In accordance with again an additional mode of the invention, the further layer contains strontium bismuth tantalate (SBT, $SrBi_2Ta_2O_9$), strontium bismuth niobate tantalate (SBNT, $SrBi_2Ta_{2-x}Nb_xO_9$, x=0–2) or derivatives, lead zirkonate titanate (PZT, $Pb(Zr,Ti)O_3$) or derivatives or barium strontium titanate (BST, $Ba_xSr_{1-x}TiO_3$, x=0–1), lead lanthanum titanate (PLT, (Pb, La)$TiO_3$), lead lanthanum zirconate titanate (PLZT, (Pb, La) (Zr, Ti)$O_3$) or derivatives.

In accordance with another mode of the invention, another conductive layer is applied to the insulation layer, again resulting in a structure having a high aspect ratio.

In accordance with a further mode of the invention, the material of the structure to be produced is in the form of a layer applied to a conductive layer. Thus, it is possible to form two closed rings, for example, which are electrically conductively connected to one another through the conductive layer. This is also intended to include the case where only a relatively thick conductive layer is produced, with the material of the upper part of the layer serving to produce the redepositions and the material of the lower part of the layer serving for conductive connection of the redepositions.

With the objects of the invention in view there is also provided a structure with a high aspect ratio, as produced by the method.

Other features which are considered as characteristic for the invention are set forth in the appended claims.

Although the invention is illustrated and described herein as embodied in a method for producing structures having a high aspect ratio, as well as a structure having a high aspect ratio, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
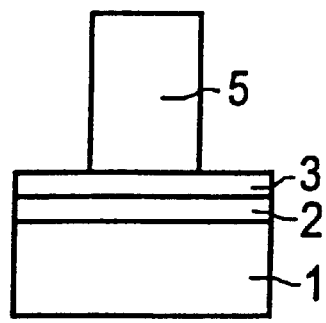
FIGS. 1 to 4 are diagrammatic, sectional views of structures illustrating a method for producing structures according to the invention having a high aspect ratio.

Referring now to the figures of the drawings in detail and first, particularly, to FIG. 1 thereof, there is seen a barrier layer 2, for example of TiN, which is applied to a silicon substrate 1. A platinum layer 3 is deposited onto this barrier layer 2 through the use of a CVD or sputtering process. The platinum of the platinum layer 3 forms a material of a structure having a high aspect ratio that is yet to be produced. Afterwards a resist layer is also applied. This resist layer is exposed and developed, thereby forming a resist mask 5. A so-called "hard mask", for example an "$SiO_2$ hard mask", could also be used instead of a resist mask 5. The resulting structure is shown in FIG. 1.

The platinum layer 3 is subsequently subjected to dry etching using the resist mask 5. The platinum layer 3 is structured through the use of a so-called plasma-assisted anisotropic etching process. Gas mixtures which do not form volatile compounds with the platinum of the platinum layer are used in the course of this process. A pure argon gas was used in the present case.

Figure 5:
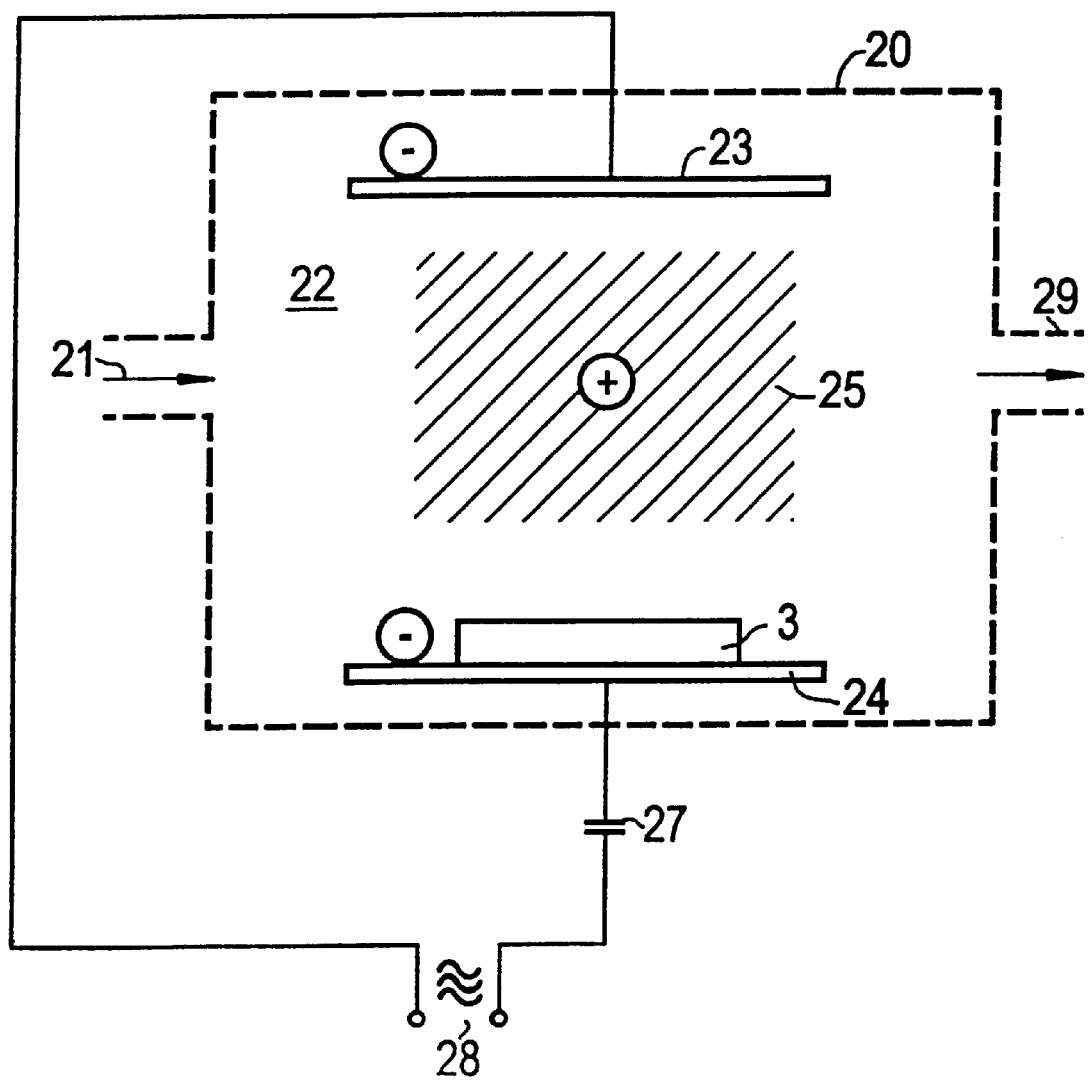
FIG. 5 is a diagrammatic and schematic view of an etching chamber which is used for the method according to the invention and is in the form of a parallel-plate reactor.

The gas is excited in an alternating electromagnetic field at low pressures. FIG. 5 represents a basic method of operation of a parallel-plate reactor 20 being used for this purpose. The argon gas is fed through a gas inlet 21 into an actual reactor chamber 22 and pumped away again through a gas outlet 29. A lower plate 24 of the parallel-plate reactor 20 is connected through a capacitor 27 to a radio-frequency source 28 and serves as substrate holder. The parallel-plate reactor 20 also has an upper plate 23. The gas is converted into a plasma 25 by the application of a radio-frequency alternating electric field to the upper and lower plates 23, 24 of the parallel-plate reactor. Since the mobility of the electrons is greater than that of the gas cations, the upper and lower plates 23, 24 are charged negatively relative to the plasma 25. The two plates 23, 24 therefore exert a high attractive force on the positively charged gas cations, with the result that they are exposed to permanent bombardment by these $Ar^+$ions. Moreover, since the gas pressure is kept low, typically 0.1–10 Pa, there is only slight scattering of the ions amongst themselves and at the neutral particles, and the ions impinge virtually perpendicularly on the surface of the platinum layer 3, which is held through the use of the substrate 1 (in a manner not illustrated in FIG. 5) on the lower plate 24 of the parallel-plate reactor. This permits good imaging of the mask 5 (in a manner also not illustrated in FIG. 5) on the underlying platinum layer 3 to be etched.

Figure 2:
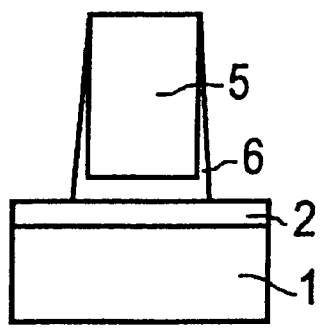

The etching of the platinum layer 3 is then effected by impulse and kinetic energy of the impinging $Ar^+$ions. Furthermore, there are no chemical reactions between the platinum of the platinum layer 3 and the $Ar^+$ions. This is why redepositions 6 of sputtered platinum on the side walls of the mask 5 occur, as illustrated in FIG. 2. These redepositions 6 have a large height ($\geq 1$ μm) yet at the same time they are very thin ($\leq 50$ nm), in a manner dependent on the height of the resist mask 5.

Figure 3:
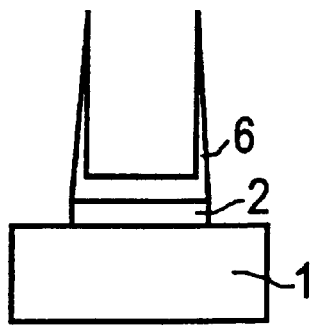

The barrier layer 2 is subsequently structured by further anisotropic dry etching and the resist mask 5 is removed by an incineration step. If an "$SiO_2$ hard mask" was used instead of a resist mask, then this hard mask can be removed by further etching, a so-called "HF dip". The redepositions 6 are preserved in the process. In this way, structures 6 having a high aspect ratio are produced as seen in FIG. 3. It may be noted in this case that FIG. 3 illustrates a section through a redeposition 6 which is inherently annularly closed. The redeposition 6 can mechanically stabilize itself by virtue of the annularly closed shape, even given a very large aspect ratio.

Figure 4:
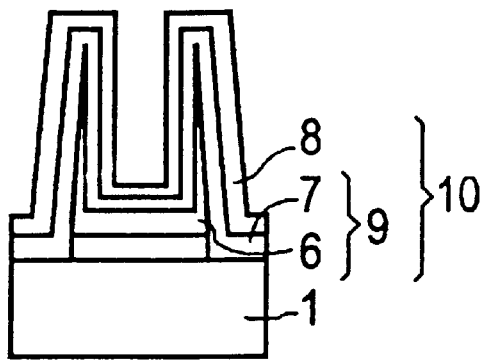

In the next step, a barium strontium titanate or BST $(Ba,Sr)TiO_3)$ layer 7 is applied as conformally as possible to the redepositions 6 through the use of a CVD process. The redepositions 6 and the BST layer 7 thus again form a structure 9 having a high aspect ratio. A conductive layer 8 is then applied to the BST layer 7. This can also be done conformally resulting in a third structure 10, which likewise has a high aspect ratio. The overall structure resulting from this process is shown in FIG. 4.

The structure 10 produced by the method according to the invention can then be used as a so-called "crown-shaped capacitor" in the memory cell of a DRAM memory chip. As a result of the crown structure, such a capacitor has a substantially larger area than a simple planar capacitor. Accordingly, the capacitance of the "crown-shaped capacitor" is also increased.

If the capacitance of such a "crown-shaped capacitor" having one wall is still not sufficient, then it is also possible to form "crown-shaped capacitors" having a plurality of walls.

As is shown, the method according to the invention enables very high ($\geq 1$ $\mu$m) and very thin ($\leq 50$ nm) structures to be produced in a relatively simple and rapid manner in only very few process steps and with only one mask technique. Structures having such large aspect ratios, particularly when they are composed of a conductive material, in particular platinum, could not be produced previously, or could be produced only with a high outlay, using other methods.

We claim:

1. A method for producing structures having a high aspect ratio, which comprises:
   providing a material of a structure to be produced, in the form of a layer;
   applying a mask with side walls to the layer;
   subjecting the layer to dry etching using the mask and forming redepositions of the layer material on the side walls of the mask; and
   removing the mask and leaving behind a structure having a high aspect ratio.

2. The method according to claim 1, which comprises carrying out the step of dry etching the layer by using a plasma etching process.

3. The method according to claim 1, which comprises providing a substance selected from the group consisting of a gas, a gas mixture and a noble gas which does not form volatile compounds with the material of the structure to be produced, during the step of dry etching the layer.

4. The method according to claim 1, which comprises carrying out the step of dry etching the layer by using a process selected from the group consisting of reactive ion etching (RIE), magnetically enhanced reactive ion etching (MERIE), electron cyclotron resonance etching (ECR etching) and inductively coupled plasma etching.

5. The method according to claim 1, which comprises setting the aspect ratio of the structure to be greater than 2.

6. The method according to claim 1, which comprises setting the aspect ratio of the structure to be greater than 10.

7. The method according to claim 1, which comprises constructing the structure to be a self-stabilizing structure.

8. The method according to claim 7, which comprises constructing the structure to be a closed structure.

9. The method according to claim 1, which comprises providing the layer as a metal selected from the group consisting of copper, iron, cobalt, nickel, a $4d$ transition metal, a $5d$ transition metal and platinum.

10. The method according to claim 9, which comprises providing the layer as containing a substance selected from the group consisting of platinum, gold, silver, iridium, palladium, ruthenium, rhenium and oxides thereof.

11. The method according to claim 1, which comprises applying at least one further layer to the structure, again resulting in a structure having a high aspect ratio.

12. The method according to claim 11, which comprises providing the further layer as an insulation layer.

13. The method according to claim 12, which comprises providing the further layer as containing a material selected from the group consisting of a ferroelectric material, a dielectric material, a dielectric material having a high relative permittivity, a perovskite and precursors of these materials.

14. The method according to claim 13, which comprises providing the further layer as containing a material selected from the group consisting of strontium bismuth tantalate (SBT, $SrBi_2Ta_2O_9$), strontium bismuth niobate tantalate (SBNT, $SrBi_2Ta_{2-x}Nb_xO_9$, x=0–2), lead zirconate titanate (PZT, $Pb(Zr,Ti)O_3$) derivatives thereof, barium strontium titanate (BST, $Ba_xSr_{1-x}TiO_3$, x=0–1), lead lanthanum titanate (PLT, $(Pb, La)TiO_3$), lead lanthanum zirconate titanate (PLZT, $(Pb, La)(Zr, Ti)O_3$) and derivatives thereof.

15. The method according to claim 12, which comprises applying another conductive layer to the insulation layer, again resulting in a structure having a high aspect ratio.

16. The method according to claim 1, which comprises applying the material of the structure to be produced in the form of a layer on a conductive layer.

17. A structure having a high aspect ratio, produced by the method according to claim 1.

* * * * *